United States Patent
Ohfuji et al.

(10) Patent No.: US 7,045,259 B2
(45) Date of Patent: May 16, 2006

(54) POST EXPOSURE MODIFICATION OF CRITICAL DIMENSIONS IN MASK FABRICATION

(75) Inventors: Takeshi Ohfuji, Tokyo (JP); Hiroyuki Inomata, Asaka (JP); Shiho Sasaki, Sakado (JP); Masa-aki Kurihara, Sayama (JP)

(73) Assignee: Intel Corporation, Santa Clara, CA (US)

( * ) Notice: Subject to any disclaimer, the term of this patent is extended or adjusted under 35 U.S.C. 154(b) by 533 days.

(21) Appl. No.: 09/965,280

(22) Filed: Sep. 26, 2001

(65) Prior Publication Data

US 2003/0059719 A1    Mar. 27, 2003

(51) Int. Cl.
*G03C 5/00* (2006.01)

(52) U.S. Cl. .................. 430/30; 430/312; 430/326; 430/330

(58) Field of Classification Search ............... 430/330, 430/325, 326, 328, 319, 318, 312, 313, 5, 430/30; 219/411
See application file for complete search history.

(56) References Cited

U.S. PATENT DOCUMENTS

| | | | |
|---|---|---|---|
| 5,398,309 | A | 3/1995 | Atkins et al. |
| 6,034,771 | A | 3/2000 | Rangarajan et al. |
| 6,100,012 | A | 8/2000 | Shi |
| 6,100,506 | A | 8/2000 | Colelli, Jr. et al. |
| 6,169,274 | B1 | 1/2001 | Kulp |
| 6,235,439 | B1 | 5/2001 | Whiting |
| 6,503,666 | B1 | 1/2003 | Pierrat |
| 6,632,576 | B1 | 10/2003 | Tejnil |
| 2003/0035089 | A1 | 2/2003 | Chandhok et al. |
| 2003/0170572 | A1 | 9/2003 | Yan |
| 2004/0157136 | A1 | 8/2004 | Chandhok et al. |

OTHER PUBLICATIONS

Section 2.7 Resists, SPIE Handbook of Microlithography,Micromachining and Microfabrication, vol. 1: Microlithography. [online] [retrieved on Aug. 3, 2001] Retrieved from the Internet <URL:http://www.cnf.cornell.edu/SPIEBook/spie7.htm pp. 1-11.
Negative e-beam resist SAL603-0.45 [online] [retrieved on Aug. 3, 2001] Retrieved from the Internet:<URL:http://www.nanophys.kth.se/nanophys/facilities/nfl/resists/sal603.html pp. 1-3.
R.D. Allen, G.M. Wallraff, D.C. Hofer and R.R. Kunz; "Photoresists for 193-nm Lithography", IBM Journal of Research and Development, vol. 41, No. 1/2 -Optical lithography.[online] [retrieved on Jun. 27, 2001] Retrieved from the Internet: <URL:www.research.ibm.com/journal/rd/411/allen.html pp. 1-10.
SPIE vol. 1086, Advances In Resists Technology and Processing.(1989) Deep UV ANR Photoresists For 248 nm Excimer Laser Photolithography. James W. Thackeray, George W. Orsula, Edward K. Pavelchek, Dianne Canistro; Shipley Co., Inc., Newton Massachusetts. Leonard E. Bogan Jr., Amanda K. Berry, Karen A. Graziano; Rohm and Hass Co., Inc. Philidelphia Pennsylvania. pp. 34-47.
Alexei L. Bogdanov, Use of SU-8 Negative Photoresist for Optical Mask Manufacturing MAX-Lab, University of Lund, SE-221 00, Lund Sweden. [online] pp. 1-11. http://www.maxlab.luy.se/beamlines/bld811. Proc. SPIE vol. 3999. Pub. 2000.
SPIE vol. 2512; Masumi Arai, Hiroyuki Inomata, Toshiharu Nishimura, Masa-aki Kurihara and Naoya Hayashi; "Application of Chemically Amplified Resists to Photomask Fabrication". Micro Products Research Laboratory, Micro Products Division, Dai Nippon Printing Co., Ltd., Japan. pp. 74-87. Pub. 1995.
SPIE vol. 2793; A Chemically Amplified Resist Process For 0.25 u M Generation Photomasks; Mikio Katsumata, Hiroichi Kawahira, Minoru Sugara and Satoru Nozawa. MOS LSI Division, Semiconductor Company, Sony Corporation, Japan. pp. 96-104. Pub.1996.

*Primary Examiner*—Christopher G. Young
(74) *Attorney, Agent, or Firm*—Blakely, Sokoloff, Taylor & Zafman LLP

(57) ABSTRACT

A system and method are described for modifying an exposure image in a radiation sensitive layer by treating the exposure image with a heterogeneous and non-uniform post exposure thermal treatment. The treatment may comprise providing different portions of the exposure feature, such as different exposure features or critical dimensions, with different thermal fluxes from a thermal modification system, such as a post exposure bake oven or hot plate configured to provide different thermal fluxes. The thermal modification system may comprise one or more adjustable spacers to adjust a radiant energy flux from a thermal energy source to the radiation sensitive layer by adjusting a separation distance between the source and the layer.

17 Claims, 14 Drawing Sheets

POST EXPOSURE MODIFICATION OF CRITICAL DIMENSIONS IN MASK FABRICATION

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software and data as described below and in the drawings hereto: Copyright © 2001, All Rights Reserved.

BACKGROUND OF THE INVENTION

1. Field of the Invention

The invention relates generally to the field of semiconductor mask fabrication. More particularly, the invention relates to a system and method for fabricating a mask using a post exposure modification of an exposure image.

2. Background Information

Masks are often used to manufacture semiconductor devices and logic products. FIG. 1 illustrates an exemplary lithography system 100 that may be used to manufacture semiconductor devices based on a mask 130. The system 100 includes a radiation source 110 to generate and transmit radiation 120 to the mask 130. The mask 130 contains a circuitry pattern 140 that creates and transmits a patterned radiation 150. Typically the patterned radiation 150 is only a portion of the radiation 120.

The patterned radiation 150 contains circuitry information and is provided to a semiconductor manufacturing process 160. Typically, the patterned radiation 150 is used to selectively print or expose portions of a resist layer and then subsequent processing is used to manufacture a semiconductor device or logic product based on the exposure.

One prior art problem is that the mask 130 and the pattern 140 may have inaccuracies, errors, or both. The inaccuracies or errors may occur due to a number of factors, such as faulty manufacturing equipment, manufacturing equipment that is not properly calibrated, and other factors. Regardless of the cause, the errors are transferred via the patterned radiation 150 to the semiconductor manufacturing process 160 and are incorporated into the manufactured semiconductor devices. This may result in a larger proportion of semiconductor devices that do not meet specifications, that have degraded performance, or that may fail.

BRIEF DESCRIPTION OF THE SEVERAL VIEWS OF THE DRAWINGS

The novel features believed characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings:

DETAILED DESCRIPTION OF THE INVENTION

In the following description, for the purpose of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Mask Fabrication

The term "mask" will be used to broadly refer to a structure comprising a functional pattern that acts as a selective barrier to the passage of radiation. According to one embodiment, a mask may be a substantially flat plate comprised of sufficiently radiation transparent portions that transmit radiation to a radiation sensitive layer and sufficiently radiation opaque portions that prevent exposure of certain areas of the radiation sensitive layer, when the layer is positioned relative to the mask and exposed to radiation. The radiation transparent portion may be a support to which a radiation-opaque pattern has been applied. For example, the mask may be a transparent quartz plate with a pattern defined by opaque chrome included on one side of the quartz plate. Alternatively, rather than quartz and chrome, the mask may be fabricated from other radiation transparent materials suitable for the intended application, such as glass, plastic, film, and other opaque materials, such as plastics, and other metals.

The pattern may be associated with circuitry to be created on a semiconductor device or logic product, although the invention is not so limited. The term "semiconductor logic product" and similar terms will be used to refer to any digital logic semiconductor product device, including but not limited to digital memory, microprocessors, coprocessors, and core logic chipsets. Without limitation, and according to one embodiment, the semiconductor logic products may be object code compatible with semiconductor logic products of Intel Corporation of Santa Clara, Calif. The pattern may correspond to one of multiple processing layers that are used to manufacture a semiconductor logic product.

Figure 1:
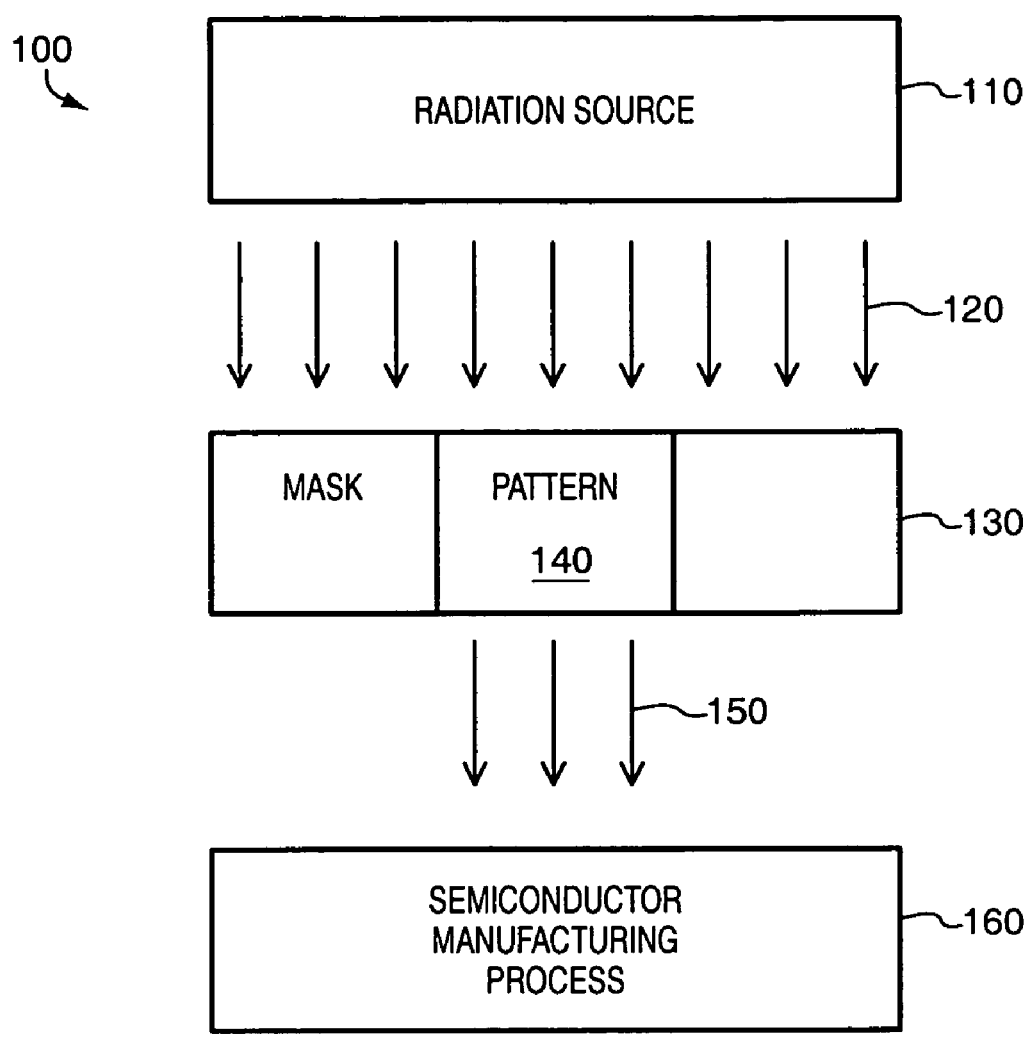
FIG. 1 illustrates a prior art lithography system that uses a mask to manufacture semiconductor devices.
Figure 2:
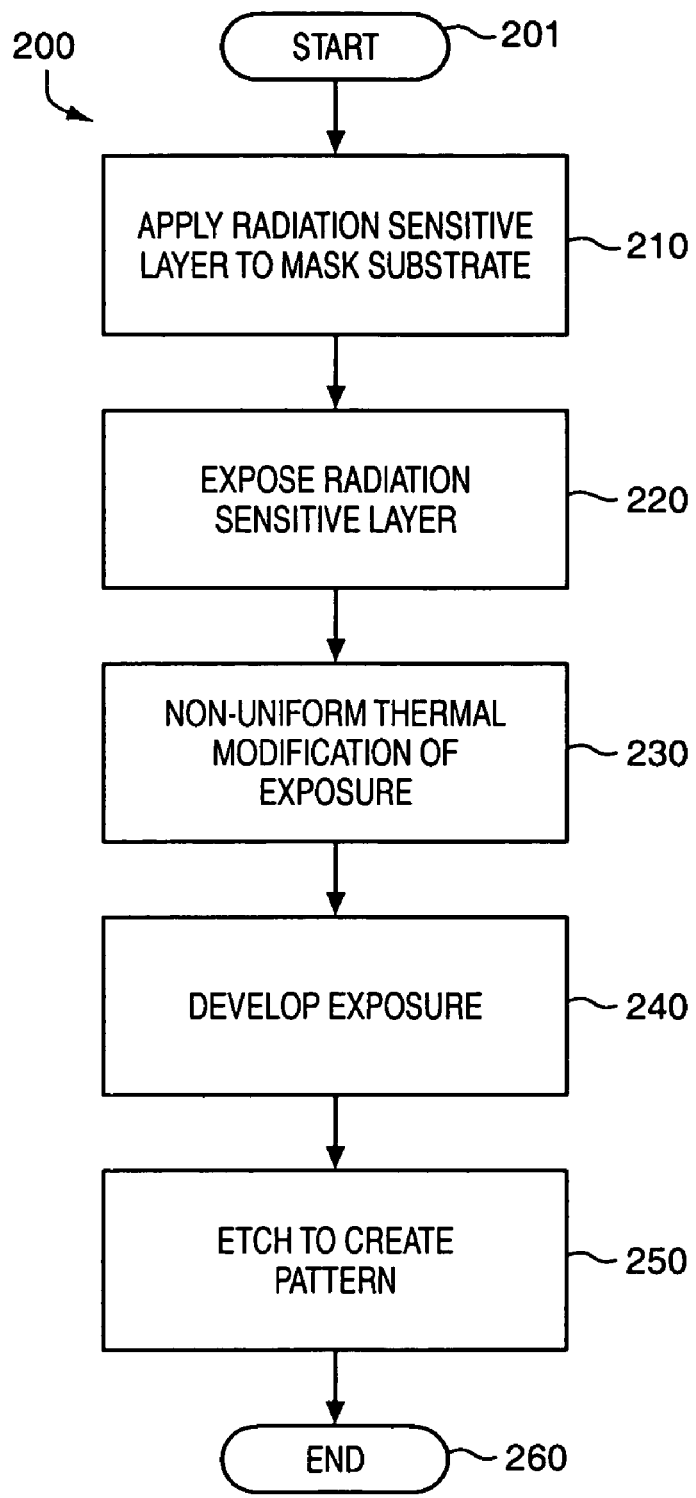
FIG. 2 illustrates in block diagram form a method for making or fabricating a mask, according to one embodiment.

FIG. 2 illustrates in block diagram form a method 200, according to one embodiment, for fabricating a mask. The method 200 commences at block 201, and then proceeds to block 210, where a radiation sensitive layer is applied to a mask substrate. The term "radiation sensitive layer" and similar terms will be used to broadly refer to a layer of material that is physically or chemically transformed when exposed to radiation (e.g., electromagnetic radiation such as light, ultraviolet light, x-rays, etc. or particle beams such as electron beams). Typically, the radiation makes or assists in making the radiation sensitive layer selectively easy or difficult to remove during development. According to one embodiment, the radiation sensitive layer is a positive resist in which exposed portions of the layer are transformed to allow them to be easily and selectively removed such as by dissolution in a solvent. According to an alternate embodiment, the layer is a negative resist in which exposed resist is transformed to make it comparably difficult to remove.

According to one embodiment, a conventional radiation sensitive layer may be applied by using conventional methods. For example, a mask substrate (e.g., chrome on quartz with an anti-reflective oxide coating) may be pre-spin treated to remove potential contaminants by washing it in deionized water and gently etching it with $O_2$ plasma, and then the layer may be spin coated on the mask substrate to a sufficiently uniform and typically predetermined layer thickness between approximately 100 and 400 nanometers (nm). After the layer is applied the temperature may be increased for a sufficient time to prepare the layer for subsequent processing. Depending on the particular layer applied, this may be done to dry the layer, evaporate solvents, improve contact with the substrate, promote chemical reactions, or for other reasons. For example, depending on the thermal characteristics of the layer and the solvents, the mask substrate and the radiation sensitive layer may be placed on a hot plate and baked for approximately 5–20 minutes at approximately 90–110° C. to evaporate solvent.

The method 200 advances from block 210 to block 220 where the radiation sensitive layer is exposed to patterned radiation. Any type of patterned radiation generating system including conventional light and electron beam systems may provide the patterned radiation. Mirror operation may be used to shape the patterned radiation. For example, the radiation sensitive layer may be exposed using an electron beam exposure system having a voltage between approximately 10–100 kV and an intensity between approximately 1–20 µC/cm².

The radiation exposes or prints at least a portion of the radiation sensitive layer. Typically the patterned radiation received at the radiation sensitive layer exposes or prints a feature having a critical dimension (CD). The terms "critical dimension", "CD" and similar terms will be used to refer to a dimension or distance associated with a feature or geometry in a pattern. For example, the CD may be a width of a feature (e.g., a line), a separation distance between two features (e.g., a distance between two lines), and other distances in the pattern. The CD may be monitored and compared with a predetermined and specified design distance or dimension as an indication of process performance and to maintain acceptable mask manufacturing standards and feature tolerances.

According to one embodiment, the patterned radiation received at the radiation sensitive layer exposes or prints a CD having a CD error. The terms "critical dimension error", "CD error" and similar terms will be used to broadly refer to an unintended, undesirable, or erroneous difference between an exposed CD and a predetermined, specified, or desired CD. The CD error may be a global CD error having a positionally dependent type of CD error, magnitude of CD error, or both. For example, CD errors may increase in magnitude while moving from right to left along the radiation sensitive layer. Typically, CD errors are not desired and if uncorrected may adversely affect semiconductor devices that are manufactured using the mask.

The method 200 advances from block 220 to block 230 where the radiation sensitive layer is modified by a sufficiently heterogeneous, non-uniform, variable thermal energy interaction. The variation may comprise a position dependent interaction comprised of a first interaction at a first position of the mask and a different second interaction at a second position. Typically, the variable thermal interaction will comprise a sufficiently heterogeneous and varied heat flux to different positions or regions of the layer to create different temperatures in those regions. These different temperatures may cause sufficiently heterogeneous, non-uniform, and potentially position variant physico-chemical transformation of the layer and its properties. These heterogeneous physico-chemical transformations may alter the exposure image created in the layer by the processing of block 220. For example, a first thermal flux may be provided to a first layer region containing a first CD having a first CD error of a particular type and magnitude to reduce the first CD error and a second thermal flux may be provided to a second layer region containing a second CD having a second CD error having a different type, magnitude, or both to reduce the second CD error. The different treatments may thus differently modify the size, the shape, or both the size and the shape of the CDs. In this way, any desired type of non-uniform thermal energy interaction may be used to modify an exposure image. Without limitation, such modifications may be used to modify exposure images, to reduce inaccuracies or errors in the exposure image, to modify CDs, to reduce inaccuracies or errors in the CDs, to actively size or shape CDs, to shrink CDs, and to provide other desired modifications.

According to one embodiment, the variable thermal energy input may be provided by a post exposure bake (PEB) system and method to provide heterogeneous heat flux to different portions of the layer. In this way, in addition the PEB system and method preparing the layer for subsequent processing (e.g., hardening the layer), the PEB system and method may perform other desired modifications of the layer by selectively promoting or de-promoting physico-chemical transformation of one region of the layer relative to another region. Rather than a small unintentional temperature variation of 1–2° C. across a hot plate, the temperature difference may be higher, intentional, and adjustable.

The method 200 advances from block 230 to block 240 where the layer is developed. Various development methods and developers are contemplated to be useful, depending on the particular implementation and the physico-chemical properties of the radiation sensitive layer. For example, an aqueous alkaline developers comprising about 1–5 wt % or preferably about 2–3 wt % solution of tetra methyl ammonium hydroxide (TMAH) may be used to dissolve portions of the layer at substantially room temperature by immersing the layer in a volume of the developer for a time between approximately 3 to 30 minutes, rinsing in fresh solvent, and removing the solvent. This may be performed at substantially room temperature or other temperatures that are suitable for the layer and for the developer. Alternatively, other methods and developers including conventional methods and organic solvents (e.g., methyl isobutyl ketone (MIBK)) may be used.

The method 200 advances from block 240 to block 250 where etching is performed to create a mask pattern. According to one embodiment, an etchant (e.g., a metal etchant) suitable to remove the radiation opaque layer (e.g., chrome) is used. According to one embodiment, etching may be performed using conventional materials and methods. The method 200 terminates at block 260.

Modifying Critical Dimensions and Error Reduction

Figure 3:
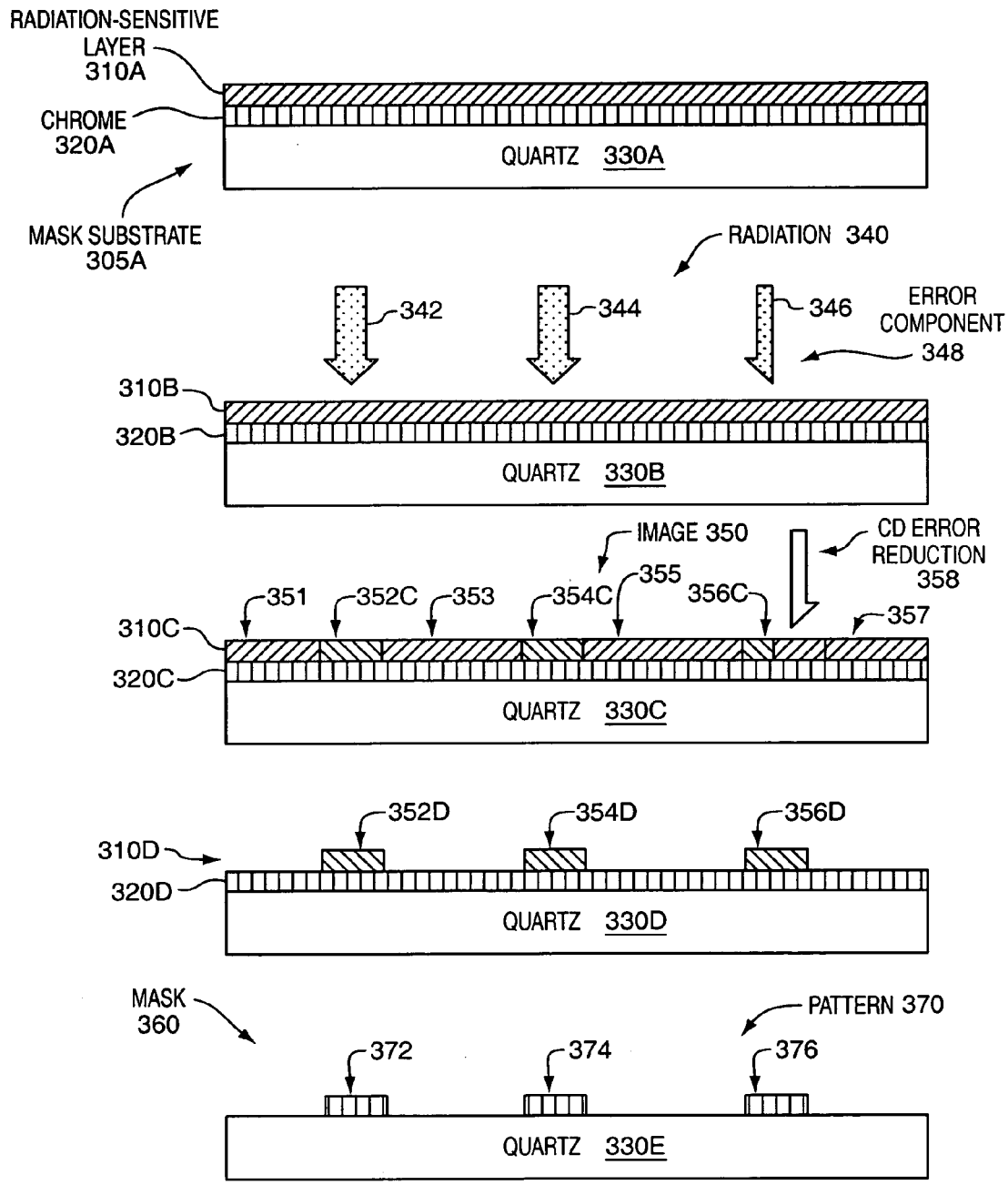
FIG. 3 illustrates mask fabrication processing that incorporates critical dimension error reduction processing, according to one embodiment.

FIG. 3 conceptually illustrates CD error reduction during mask fabrication, according to one embodiment. A radiation sensitive layer 310A is applied to a mask substrate 305A comprising a layer of chrome 320A on quartz 330A. Electron beam radiation 340 that contains pattern information is transmitted to the radiation sensitive layer 310B. The radiation 340 includes portions 342, 344, and 346 that are each transmitted to different regions of the layer 310B. The radiation portion 346 comprises an error component 348 that causes a CD error. The error component 348 is conceptually illustrated as a missing half of the radiation portion 346, which may conceptually represent radiation blockage or transmission errors, although the error component 348 is to be regarded more broadly to include additional types of errors that result in CD errors in an exposure image created in the radiation sensitive layer 310B by the radiation portion 346. For example, the error may be due to mispositioning of the radiation 346, subwavelength effects such as optical proximity error, and others.

The radiation 340 exposes the radiation sensitive layer 310B to create the radiation sensitive layer 310C having an exposure image 350. The image 350 comprises a pattern of exposed and unexposed regions including unexposed regions 351, 353, 355, and 357 and exposed regions 352C, 354C, and 356C. Lengths of the exposed regions may be CDs. The radiation portion 346 exposes the region 356C that has a CD error, due to the error component 348.

The CD error corresponding to the exposed region 356C may be reduced to bring the CD closer to the desired predetermined CD by treating a region comprising the CD error, a region comprising 356C, a region comprising 357, or other proximate regions with a CD error reduction 358. As discussed elsewhere, the CD error reduction 358 may comprise a different (e.g., increased or decreased) thermal energy interaction than used to treat other regions of the layer 310C.

After treatment by the CD error reduction 358, the layer 310C is developed. The particular development shown is characteristic of a negative-type layer in which unexposed regions 351, 353, 355, and 357 are removed and exposed portions 352D, 354D, 356D become selectively difficult to remove during development. As a result of the CD error reduction processing, a CD of the region 356D has increased and the CD error corresponding to the region 356D has been reduced. Advantageously, this reduction of the CD error for the region 356D may be carried forward through subsequent processing to result in a mask with an improved pattern that may produce better semiconductor devices. For example, the regions 352D, 354D, and 356D and the layer 320D are etched to create the mask 360 having the pattern 370 comprised of chrome regions 372, 374, and 376 on quartz 330E. The chrome region 376 has a CD that is more similar to the CD of the region 356D than to the CD of the exposed region 356C, due to the CD error reduction 358.

Exemplary Critical Dimension Errors

Figure 4:
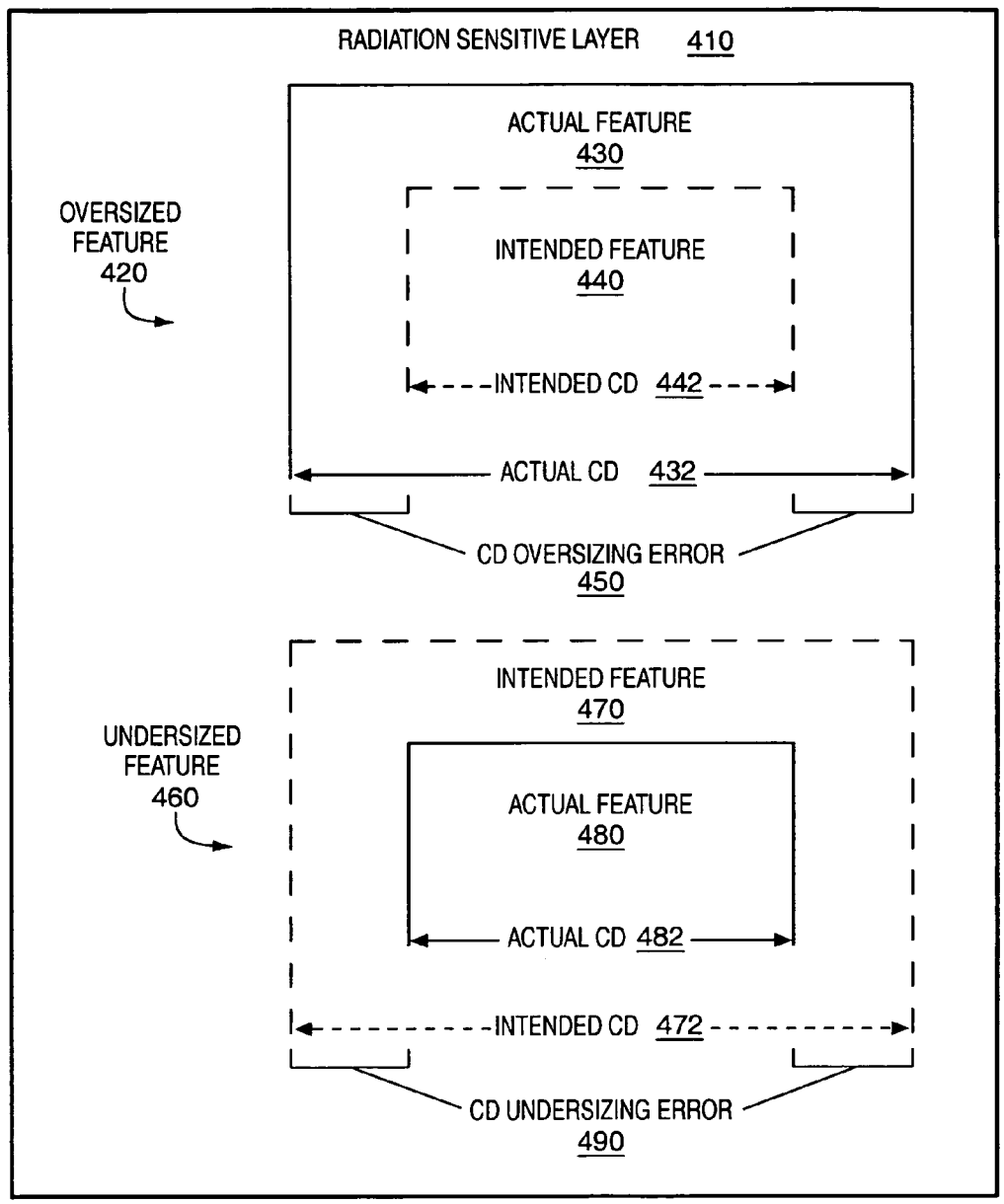
FIG. 4 illustrates different types of critical dimension errors, according to one embodiment.

FIG. 4 conceptually illustrates exemplary types of CD errors, according to one embodiment. A radiation sensitive layer 410 comprises an oversized feature 420 having a CD oversizing error 450 and an undersized feature 460 having a CD undersizing error 490.

The oversized feature 420 comprises an actual feature 430 having an actual CD 432. An intended feature 440 is shown for comparison to illustrate the CD oversizing error 450. By way of example, the intended feature 440 may have a size that the mask fabricator desired to create on the radiation sensitive layer 410. Without limitation, the intended feature 440 may better approximate or correspond to a predetermined designed circuitry pattern and may manufacture more compliant or better performing electronic circuitry components than the actual feature 430. The intended feature 440 comprises an intended CD 442 that is smaller in dimensional length than the actual CD 432. As shown, the CD error may be comprised of potentially unequal contributions on each end of the actual CD 432. The CD oversizing error 450 will also be referred to as a positive error that results from the actual CD 432 being larger than the intended CD 442.

The undersized feature 460 comprises an actual feature 480 having an actual CD 482. The actual feature 480 and the actual CD 482 are both smaller than an intended feature 470 and an intended CD 472. As shown, the CD error may be comprised of potentially unequal contributions on each end of the actual CD 482. The CD undersizing error 490 will also be referred to as a negative CD error that results from the actual CD 482 being smaller than the intended CD 472.

Thermal Modification Systems

Figure 5:
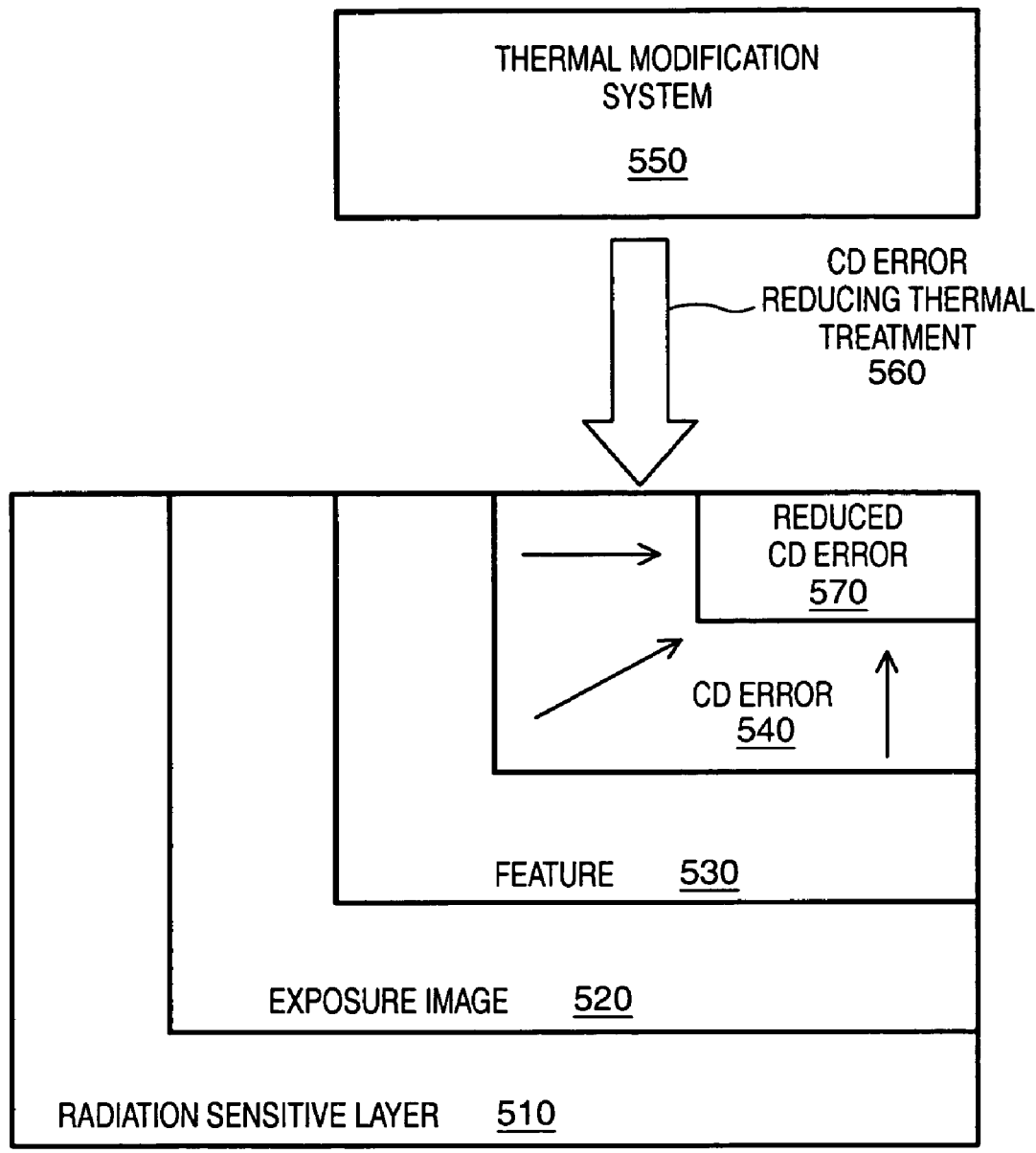
FIG. 5 illustrates a thermal modification system to reduce a critical dimension error, according to one embodiment.

FIG. 5 conceptually illustrates a thermal modification system 550 to modify an exposure image and to reduce a CD error, according to one embodiment. A radiation sensitive layer 510 has an exposure image 520 that includes a feature 530, such as a CD. By way of example, the feature 530 may be associated with an intended circuitry pattern to be created on a mask that is used to create semiconductor devices.

The feature 530 has a CD error 540. The thermal modification system 550 provides a CD error reducing treatment or dose 560 to the feature 530 and the CD error 540. According to one embodiment, the treatment is a thermal treatment in which thermal energy is used to increase a temperature of the radiation sensitive layer proximate to the feature 530. According to one embodiment, the treatment is applied to a region containing the feature 530 based on a type and magnitude of the CD error 540 and a different treatment is applied to other regions containing CDs having different types or magnitudes of CD errors. Advantageously, in this way, different treatments may be applied and used to compensate or reduce CD errors.

Affects of Radiation Sensitive Layer

The CD error reducing system 550 may provide different CD error reducing treatments 560 or other modifications, depending on the characteristics of the radiation sensitive layer and depending on the type and magnitude of CD error. For example, the treatment 560 may be different for positive-acting and negative-acting resists, and may be different for positive CD errors and negative CD errors.

According to one embodiment, the radiation sensitive layer may comprise a negative acting, chemically amplified radiation sensitive layer comprising a radiation sensitive chemical species that induces physico-chemical transformation of the layer in a way that is modifiable by the thermal modification system 550 and the treatment 560. The transformation may be a molecular weight increasing crosslinking reaction that is initiated by the radiation, that reduces solubility in the developer, and that proceeds dependent upon post exposure thermal treatment of the layer including how the treatment affects the relative rates of crosslinking reaction, initiator diffusion, and initiator deactivation.

For example, the radiation sensitive layer may comprise the commercially available, negative acting, chemically amplified resist SAL-601 available from Shipley Company of Marlborough, Mass., a subsidiary of Rohm and Haas Company of Philadelphia, Pa. The resist SAL-601 comprises a base polymer, a radiation-activated acid catalyst generator, and a crosslinking agent. After exposure, and at sufficiently elevated temperatures, the acid catalyst diffuses and promotes crosslinking reaction between a melamine cross linker on one polymeric chain and a corresponding proximate hydroxide functional group on another polymeric chain. The crosslinking may make exposed regions selectively difficult to remove by aqueous alkaline developer compared with non-exposed regions. The exact way that the temperature of the layer changes over time may affect the rates of diffusion and reaction and result in crosslinked regions having different characteristics (e.g., crosslinking hardness) as well as size. Without limitation, temperature scenarios that provide larger total diffusion may increase the size of the crosslinked region while scenarios that provide smaller total diffusion may decrease the size of the crosslinked region. Accordingly, layer portions that are exposed to different temperatures at different times may experience and reflect different post exposure thermal modifications, which may be used advantageously to affect desired modifications. At some point the activity of the catalyst may decrease. Without limitation, this may be due to an actual thermal decomposition, due to the catalyst becoming bound by crosslinked regions, and due to other factors.

Different modifications of the activated catalyst exposure image may be achieved by introducing heterogeneity and non-uniformity into the thermal treatment path of the exposure image. The different treatment path may comprise supplying different thermal fluxes to different portions of the layer to cause the portions to experience different temperature profiles over time, which may cause modification of the crosslinking for those different portions including affecting the density of the crosslinking reactions and affecting the "reach" of the crosslinking at the exposed-unexposed feature edges.

For such a negative acting, chemically amplified embodiment, a negative CD undersizing error 540 may be reduced by a high flux thermal treatment 560 that provides a region of the layer containing the feature 530 with more thermal energy in a shorter period of time, compared to a treatment used for a feature 530 having a smaller negative CD undersizing error, a CD having zero error, or a positive CD oversizing error. Without limitation, this additional energy may encourage or promote crosslinking near an exposed-unexposed boundary of the feature 530, during a time period before the activity of the acid catalyst is decreased and is no longer available or effective to catalyze the crosslinking reactions. In this way, thermal energy may be used to modify and make the acid catalyst activated exposure feature 530 larger post exposure by causing crosslinking to reach further into an unexposed region containing the feature 530.

Likewise, a positive CD oversizing error 540 for a feature 530 may be reduced by a treatment 560 that provides a region of the layer proximate to or containing the feature 530 with less thermal flux compared to a treatment 560 that is provided to region containing a feature having a less positive CD oversizing error, substantially no CD error, or negative CD undersizing error. Without limitation, this reduced energy may discourage or comparatively reduce crosslinking near an exposed-unexposed boundary of the feature 530 during a period when the catalyst is active. In this way the reach of crosslinking reactions may be confined and reduced compared to other regions that experience higher temperatures resulting from higher thermal energy flux. Such restriction of crosslinking may effectively shrink an feature 530 by not allowing it to grow as much as another feature that receives comparatively more flux.

Alternatively, rather than such a negative acting chemically amplified resist, the resist may be any other type of resist including a physicochemical imaging mechanism that is thermally modifiable post exposure by a non-uniform thermal interaction with the layer portions. For example, the resist may be a negative acting resist, a positive acting resist, a chemically amplified resist, or other resists and may be based on a variety of imaging mechanisms including deprotection, depolymerization, rearrangement, intramolecular dehydration, condensation, cationic polymerization, and others.

For purposes of illustration, consider a positive acting, chemically amplified resist, based on a deprotection imaging mechanism the in which portions that are exposed to radiation become selectively easy to remove by development. For example, consider the particular chemistry of the resist t-butoxycarbonyl (tBOC) resists available from IBM Corporation of Armonk, N.Y. The tBOC resist comprises a lipophyllic group and an acid catalyst generator to generate an acid catalyst in response to radiation that at elevated temperatures cleaves the lipophyllic group to a developer soluble hydrophilic group. As in the case of the Shipley resist discussed above, the temperature path of the resist post exposure may affect the rates of reaction, acid catalyst diffusion, acid catalyst deactivation, and other phenomena. Accordingly, treating different portions of the resist with different thermal energy input flux may result in different temperatures in the layer portions at different times, which may in turn result in different "reach" of the cleavage/deprotection transformations and different feature resolutions. Accordingly, different thermal fluxes may be used to modify exposure images and exposure features.

For this resist and for other resists based on arbitrary physicochemical compositions and transformations, empirical investigations involving heterogeneous thermal fluxes may be used to investigate temperature over time paths that lead to desired modifications of an exposure feature size, shape, or both. For example, a particular exposure feature may be exposed to baseline thermal flux, relatively low thermal flux, and relatively high thermal flux, to determine for that particular resist whether the low flux or the high flux effectively expands the "reach" of the exposure region. Accordingly, similar and more sophisticated empirical investigations may be used to determine heterogeneous thermal treatments of an exposure image for an arbitrary radiation sensitive layer that has post exposure physicochemical transformations that may be modified by post exposure thermal treatment.

CD Errors May Depend on Mask Position

Figure 6:
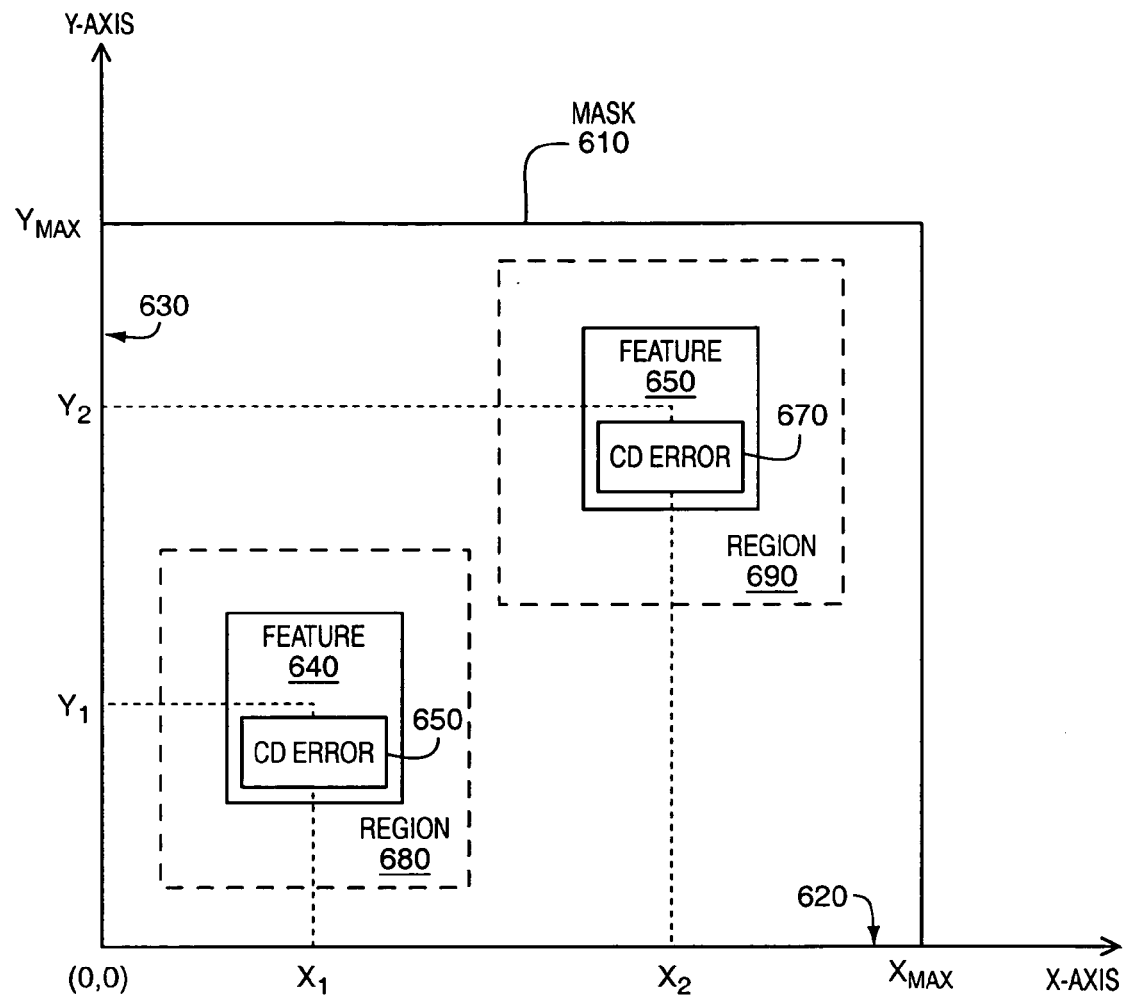
FIG. 6 illustrates critical dimension errors that depend on mask position, according to one embodiment.

FIG. 6 conceptually illustrates that CD errors may depend on mask position, according to one embodiment. A rectangular mask 610 has an associated conceptual x-axis along a first edge 620 and a perpendicular y-axis along a second edge 630. The mask 610 includes a first region 680 having a first pattern feature 640 associated with mask coordinates ($x_1$, $y_1$) and a second region 690 having a second pattern feature 660 associated with mask coordinates ($x_2$, $y_2$). The first feature 640 has a first CD having a CD error 650 and the second feature 660 has a second CD having a CD error 670. According to one embodiment, the CD errors 650 and 670 increase in at least one direction along the mask 610. For example, the CD errors in the mask 610 may increase from CD error 650 to CD error 670 as a result of an increase of x from $x_1$ to $x_2$, as a result in an increase of y from $y_1$ to $y_2$, or as a result of an increase in position along a line connecting points ($x_1$, $y_1$) and ($x_2$, $y_2$), which may represent any arbitrary line in the mask 610. Alternatively, depending on mask fabrication, different relationships between the CD errors are contemplated. For example, CD error may increase or decrease with radial distance from a center point of the mask 610. According to another embodiment, a feature has a CD error that is more similar in magnitude to CD errors corresponding to proximate features compared to less proximate features. For example, the region 680 may on average have a larger CD error than the region 690.

CD Error Reduction by Adjusted Energy Input

Figure 7:
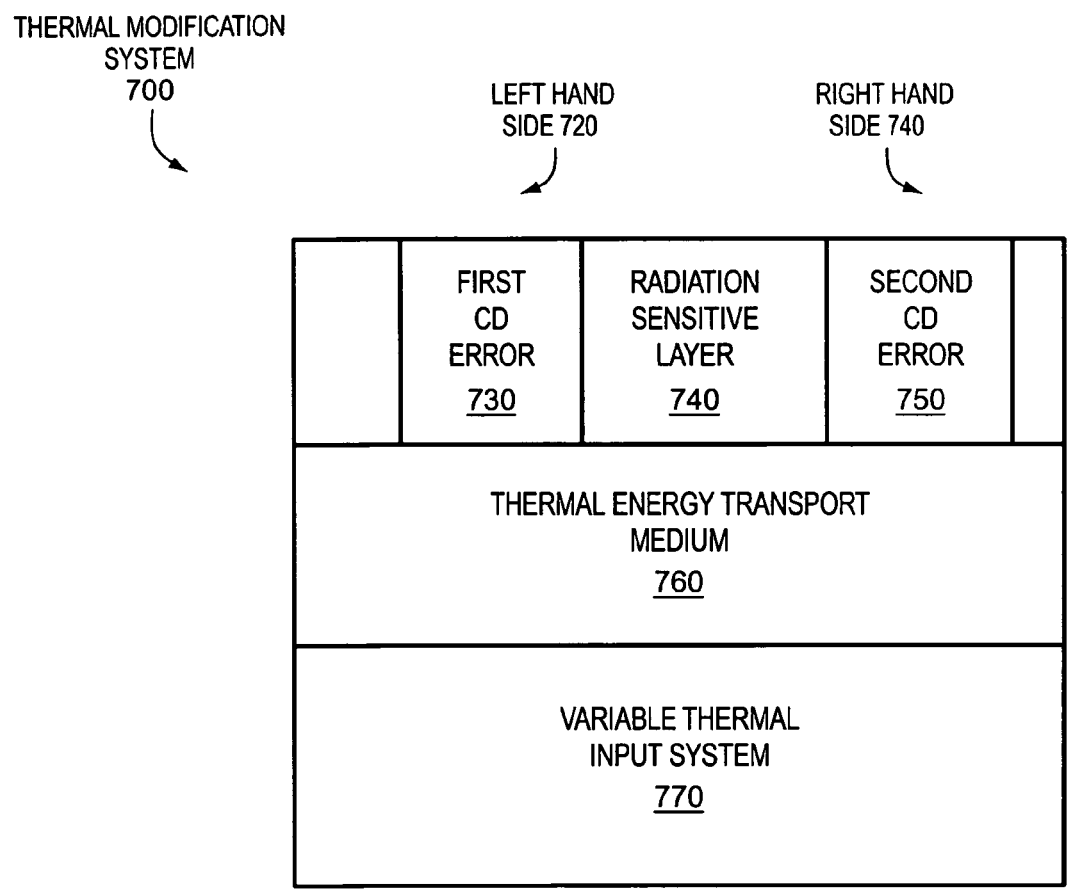
FIG. 7 illustrates a thermal modification system having a variable thermal input, according to one embodiment.

FIG. 7 conceptually illustrates a thermal modification system 700, according to one embodiment. The system 700 may be used to reduce a CD error. The system 700 includes a radiation sensitive layer 710, a thermal energy transport medium 760, and a variable thermal input system 770 to reduce a CD error of the layer 710 by transferring different amounts of thermal energy to the radiation sensitive layer 710 via the transport medium 760.

The radiation sensitive layer 710 has a first CD error 730 on a left hand side of the system 720 and a second CD error 750 on a right hand side of the system 740. The thermal energy transport medium 760 may be any medium able to conduct thermal energy. For example, the thermal energy transport medium may comprise a layer of chrome on a layer of quartz. Depending on the particular implementation, the medium 760 may comprise other medium such as a gas-filled void interface to the system 770. As desired, the medium 760 may provide a sufficiently consistent and uniform heat flux to the layer 710.

According to one exemplary embodiment, the radiation sensitive layer 710 may be a negative type, chemically amplified resist having an acid catalyst to diffuse and promote crosslinking reactions. Based on knowledge or estimation that the first CD error 730 may be a CD undersizing error, the variable thermal input system 770 may be adjusted, configured, or instructed to reduce the first CD error 730 by providing a high thermal energy flux treatment on the left hand side 720. That is, in such an embodiment, a CD undersizing error 730 may be reduced by a thermal modification system 700 that includes a variable thermal input system 770 to provide comparatively more energy flux to the undersizing error 730 compared to a CD with less undersizing error, no CD error, or CD oversizing error.

Alternatively, according to another exemplary embodiment, the second CD error 750 may be a CD oversizing error that may be reduced by a low thermal energy flux on the right hand side 740. That is, in such an embodiment, a CD oversizing error 750 may be reduced by a system 700 to provide comparatively less flux to the oversizing error 750 compared to the flux provided to a CD with less oversizing error, substantially no CD error, or CD undersizing error.

Different types of variable thermal input system 770 are contemplated. According to one embodiment, the system 770 may provide variable conductive heat energy. For example, the heat may be conducted from a surface with non-uniform temperatures that are each controlled by a temperature control system involving multiple temperature setpoints to a layer 710 in contact with the surface. According to another embodiment, the system 770 may provide variable convective heat energy. For example, gas having different temperatures may be blown toward the layer or different heat fluxes may be provided based on different natural convection zones that deliver convective heat to the layer 710. In still another embodiment, the system 770 may provide variable radiant heat energy to the layer 710. For example, the system 770 may comprise an infrared or heat lamp to provide variable intensity or duration of exposure. Alternatively, rather than an infrared lamp, variable radiant heat energy may be provided by a surface having a non-uniform temperature distribution. For example, the surface may have a high temperature right hand side that provides the layer 710 with a high radiant energy flux and a comparatively lower temperature left hand side that provides the layer with a lower flux of radiant energy. Alternatively, rather than an infrared lamp or this non-uniform surface temperature, the variable radiant energy input may be provided by a variable separation distance between the layer 710 and a thermal energy input system having a substantially uniform surface temperature. For example, as will be explained further below, such an embodiment may provide one or more height adjustable spacers to provide a variable and adjustable separation distance between the layer 710 and a post exposure bake hot plate. Alternatively other embodiments are contemplated to be useful for providing a variable thermal energy input to the layer 710 and will be apparent to a person having an ordinary level of skill in the art based on the present disclosure.

CD Error Reduction System Having Adjustable Spacers

Figure 8:
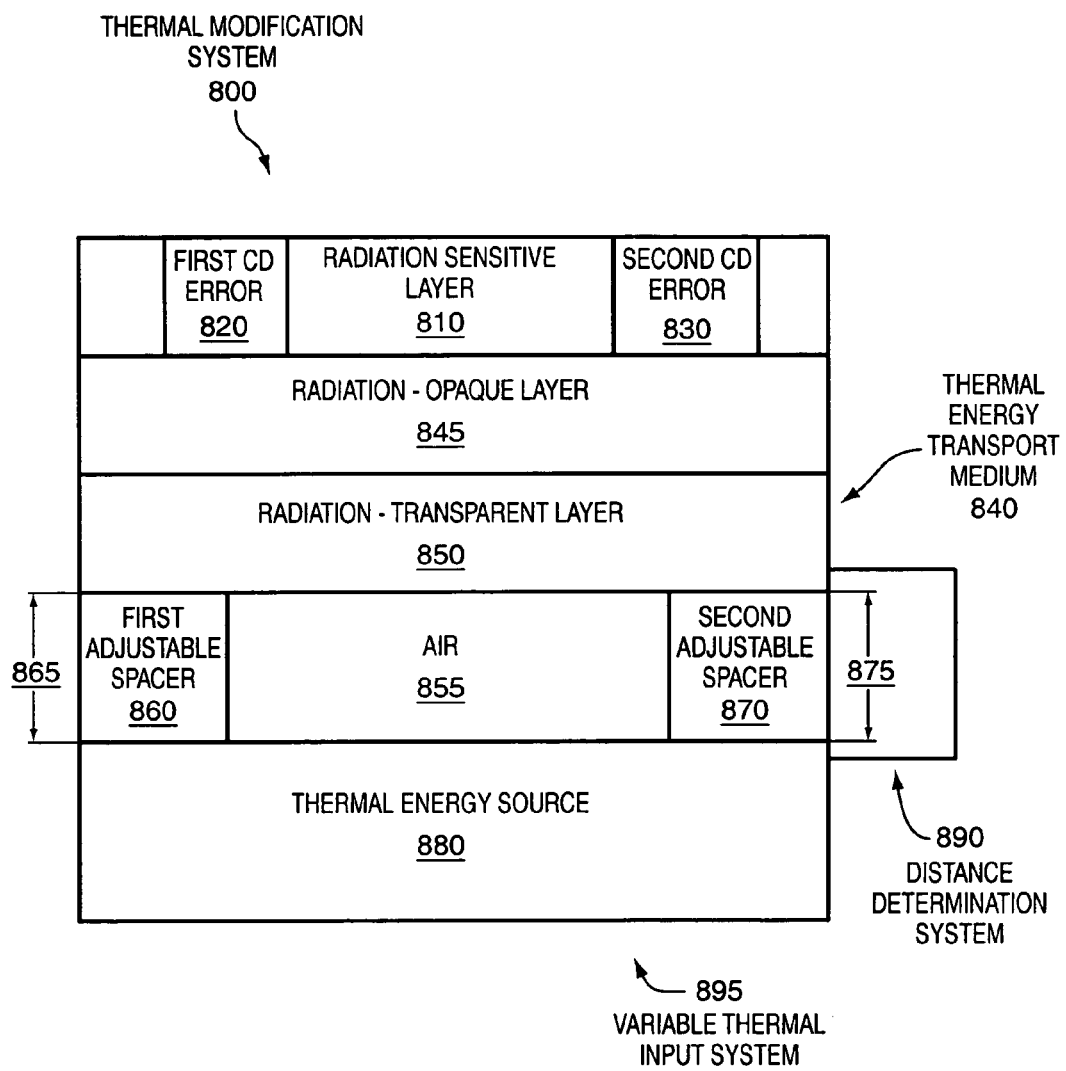
FIG. 8 illustrates a thermal modification system having an adjustable spacer, according to one embodiment.

FIG. 8 conceptually illustrates a thermal modification system 800 having adjustable spacers, according to one embodiment. The system 800 may be used to reduce a CD error. The system 800 includes a radiation sensitive layer 810, a thermal energy transport medium 840, and a variable thermal input system 895 comprising a first and second height adjustable spacer 860 and 870, and a thermal energy source 880 to reduce a CD error of the layer 810 by transporting thermal energy through the medium 840. As shown, the thermal energy transport medium 840 may comprise a radiation-opaque layer 845 (e.g., chrome), a radiation-transparent layer 850 (e.g., quartz), and air 855 that separates the thermal energy source 880 and the radiation-transparent layer 850.

The radiation sensitive layer 810 comprises a first CD error 820 and a second CD error 830. Typically at least one of the CD errors 820 and 830 may be reduced by a thermal energy interaction or treatment from the system 800 that depends on adjustments of a first adjustable spacer 860 having a first adjustment distance 865 and a second adjustable spacer 870 having a second adjustment distance 875. For example, either of the spacers 860 and 870 may be adjusted to lengthen or shorten the distances 865 and 875. Such adjustments may increase or decrease the thermal energy that is transmitted to the CD errors 820 and 830 due to thermal energy transport, such as by radiation, convection (e.g., free convection due to heated air rising from the thermal energy source 880), conduction, or by combinations of these transport phenomena. For example, increasing the distance 875 by adjusting the spacer 870 may decrease the amount of radiant heat energy that is transported to the second CD error 830 by way of radiant heat transfer from a right hand side of the thermal energy source 880. Without limitation, the amount of radiant heat energy transferred may vary substantially proportionally to the square of the height 875.

The first and second adjustable spacers 860 and 870 may be any type of spacers sufficient to couple the radiation sensitive layer 810 with the thermal energy source 880 at adjustable separation distances 865 and 875. According to one embodiment, the spacers 860 and 870 are able to accurately and reliably adjust the separation distances 865 and 875 based of human and/or device input. For example, depending on the particular implementation, the spacers 860 and 870 may be able to reliably adjust the distances 865 and 875 by approximately 10 micrometers, 50 micrometers, or 100 micrometers.

Typically, the spacers 860 and 870 receive energy and do work by adjusting the heights 865 and 875, respectively. According to one embodiment, the spacers 860 and/or 870 are mechanically adjustable and they receive mechanical energy (e.g., rotational, translational, pressure/volume, or other conventional forms) from a human or device (e.g., a motor) and adjust the height 865 and/or 875 to change the distance of separation of the radiation sensitive layer 810 and the thermal energy source 880. For example, the spacers 860 and/or 870 may be jacks that are adjustable by translational energy applied through a lever or rotational energy applied through a gear, pistons that are adjustable by energy applied through pressure, screws that are adjustable and provide linear motion based on rotational energy input, nails or spikes that are adjustable by translational energy, and by other conventional height-adjusting systems.

According to an alternate embodiment, the spacers 860 and/or 870 are electrically adjustable spacers that receive electrical energy directly and adjust the heights 865 and/or 875. For example, the spacers 860 and/or 870 may be piezo-electric spacers that generate a particular predetermined mechanical force associated with a distance 865 and/or 875 that corresponds to an input voltage.

Depending on the particular implementation, the spacers 860 and 870 may be made of different materials of construction. According to one embodiment, the spacers may comprise metal such as stainless steel or aluminum, plastic, ceramic, quartz, or other materials. The desired material may have a sufficiently low thermal conductivity to reduce conductive heat transfer from the thermal energy source 880 to the radiation sensitive layer 810. Alternatively, a low-conductivity insulating spacer may be functionally coupled between the energy source 880 and the layer 850. For example, a polyamide o-ring or piece may be between the spacer 870 and the layer 850.

According to one embodiment, the spacer 860 may comprise a distance measurement system to measure a distance associated with the spacer 860. Conventional distance measurement systems and methods may be used. For example, the distance measurement system may be an electrical measurement system that measures an electrical property such as conductance, resistance, capacitance, or another property of a length of the air 855 that corresponds to an adjustment of the spacer 860. Alternatively, a laser-based system may be used to measure the distance. The distance measurement system may comprise a scale of distance intervals, such as a ruler comprises.

The thermal energy source 880 may be a thermal energy source to supply thermal energy via conventional forms of thermal energy exchange such as conduction, convection, and radiation. According to one embodiment, the thermal energy source 880 is a temperature elevated radiant energy source that emits radiant energy through the medium 890, which may be a gas (e.g., nitrogen, air, dry air, etc) or a vacuum to transmit the radiant energy to the radiation sensitive layer 810 via the layers 840 and 850. For example, the thermal energy source 880 may be similar to a hot plate and may have an electrical energy source and a resistance to convert electrical energy into thermal energy. Alternatively, the thermal energy source 880 may include a lamp (e.g., a radiant energy lamp or an infrared lamp). Depending on the particular thermal energy source 880, the system 800 may often comprise an interface to a source of electrical energy (e.g., an outlet, a generator, or a battery).

Exemplary Temperature Profiles

Figure 9:
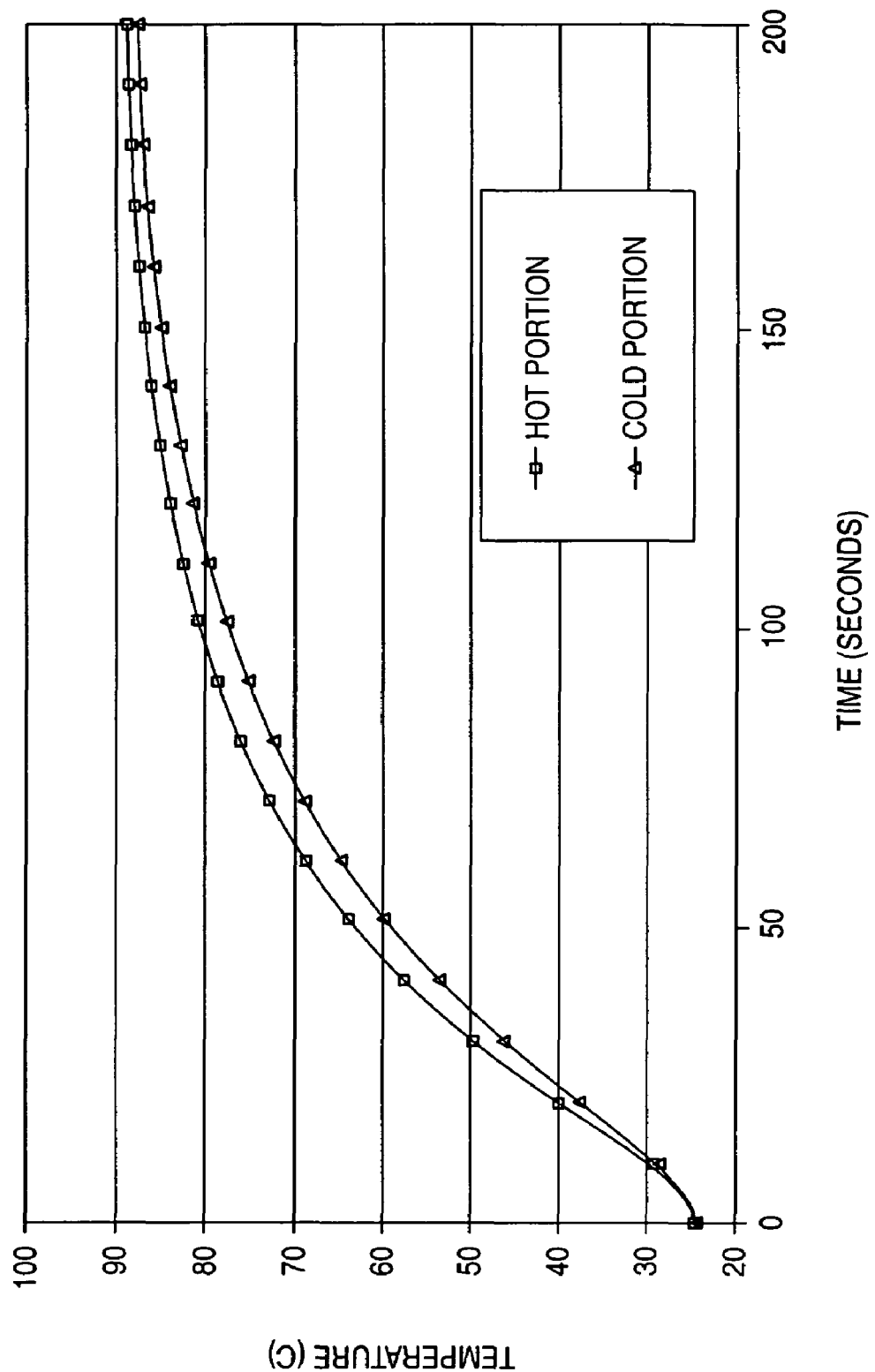
FIG. 9 illustrates exemplary temperature profiles, according to one embodiment.

FIG. 9 conceptually illustrates exemplary temperature profiles for post exposure thermal treatment of a radiation sensitive layer, according to one embodiment. The two curves, one indicated by open boxes and one by open triangles, show different layer temperatures resulting from a heterogeneous, non-uniform post exposure thermal treatment.

In the shown embodiment, the temperature of all portions of the layer is increased from a starting temperature that may be approximately room temperature to a final temperature that may be approximately 2–5 times, or preferably around 3.5 times higher than the starting temperature, during a period of approximately 3–5 or preferably about 4 minutes. Different portions receive different thermal fluxes and achieve different temperatures at different times. The curve indicated by open boxes is labeled hot portion to indicate that it corresponds to a portion of the radiation sensitive layer that receives high thermal fluxes. Likewise, the curve indicated by open triangles is labeled cold portion to indicate that it corresponds to a portion that receives lower thermal fluxes and achieves a relatively lower temperature.

The initial time portions at temperatures above approximately 50–70° C. may more strongly affect modifications of the exposure image than previous times at lower temperatures or subsequent times at higher temperatures. Without limitation, in the case of the Shipley resist, the crosslinking reactions may be slow at temperatures below 40° C. and at subsequent higher temperatures and longer times the catalyst may be deactivated or bound by crosslinked regions. Accordingly, difference between the two curves during these periods may be used to affect heterogeneous modifications of the exposure image. In particular, the differences may be effective to differently balance kinetic acceleration of crosslinking reactions, diffusion of acid catalyst, and acid catalyst deactivation in resists, such as the Shipley SAL resist, which may lead to exposure image modification. For example, without limitation, such a heterogeneous thermal post exposure treatment of the layer may be used to "grow" an undersized feature with the hot treatment and comparably "shrink" an oversized exposure feature in a negative type, chemically amplified resist, such as the Shipley SAL resist.

As desired, the higher temperatures may be maintained for a time sufficient to harden the radiation sensitive layer, cure the layer, remove moisture, diffuse radiation sensitive components, and/or encourage a good develop. For example, the temperature may be maintained at approximately 80–120° C. for approximately 5–30 minutes, or preferably at approximately 90–100° C. for approximately 10 minutes.

Different thermal treatments are also contemplated. According to one embodiment, the temperature is increased more slowly than shown in FIG. 9. For example, the temperature may be increased from approximately room temperature at time zero, to approximately 30–40° C. at one minute, to approximately 70–80° C. at 2 minutes, to approximately 80–90° C. at 3 minutes, and thereafter to approximately 85–95° C. Alternatively, regular temperature rates of change may be preferred in certain embodiments. For example, the layer temperature may be subjected to a constant rate of increase, a constant rate of temperature acceleration, or a constant rate of temperature deceleration. Alternatively, rather than these thermal treatments and their equivalents, a person having an ordinary level of skill in the art may determine treatments that are effective for any type of radiation sensitive layer for which an exposure image may be modified post exposure, without undue experimentation, based on the present disclosure, by empirically investigating multiple different temperature ramping profiles and determining which profile achieves the desired exposure image modification.

Table 2 contains exemplary thermal energy gradient data for a system such as system 800, according to one embodiment. According to one embodiment, the data represents a system 1 minute after ramping according to the ramping profile of FIG. 9, when the thermal energy source 880 temperature was approximately 60 degrees Celsius.

| DIFFERENCE BETWEEN DISTANCES (MICROMETERS) | DIFFERENCE BETWEEN TEMPERATURES (DEGREES CELSIUS) |
|---|---|
| 0 | 0 |
| 15 | 5 |
| 25 | 7 |
| 45 | 10 |
| 70 | 13 |

A first column contains a difference in distance between the radiation sensitive layer 810 and the thermal energy source 880 for different adjustment scenarios. According to one embodiment, the differences listed in the first column primarily account for the difference between the distances 865 and 875. A second column contains difference in temperature between a right hand side corresponding to the distance 865 and a left hand side corresponding to the distance 875. As shown, the temperature difference in the second column increases as the difference between the distances increases. The shorter distance corresponds to the hotter temperature. Without limitation, the temperature difference may be due to a decrease in radiant heat energy reaching the radiation sensitive layer 810 as well as other contributing factors (e.g., free convection due to hot gasses rising from the source 880.

CD Error Reducing Temperatures

Figure 10:
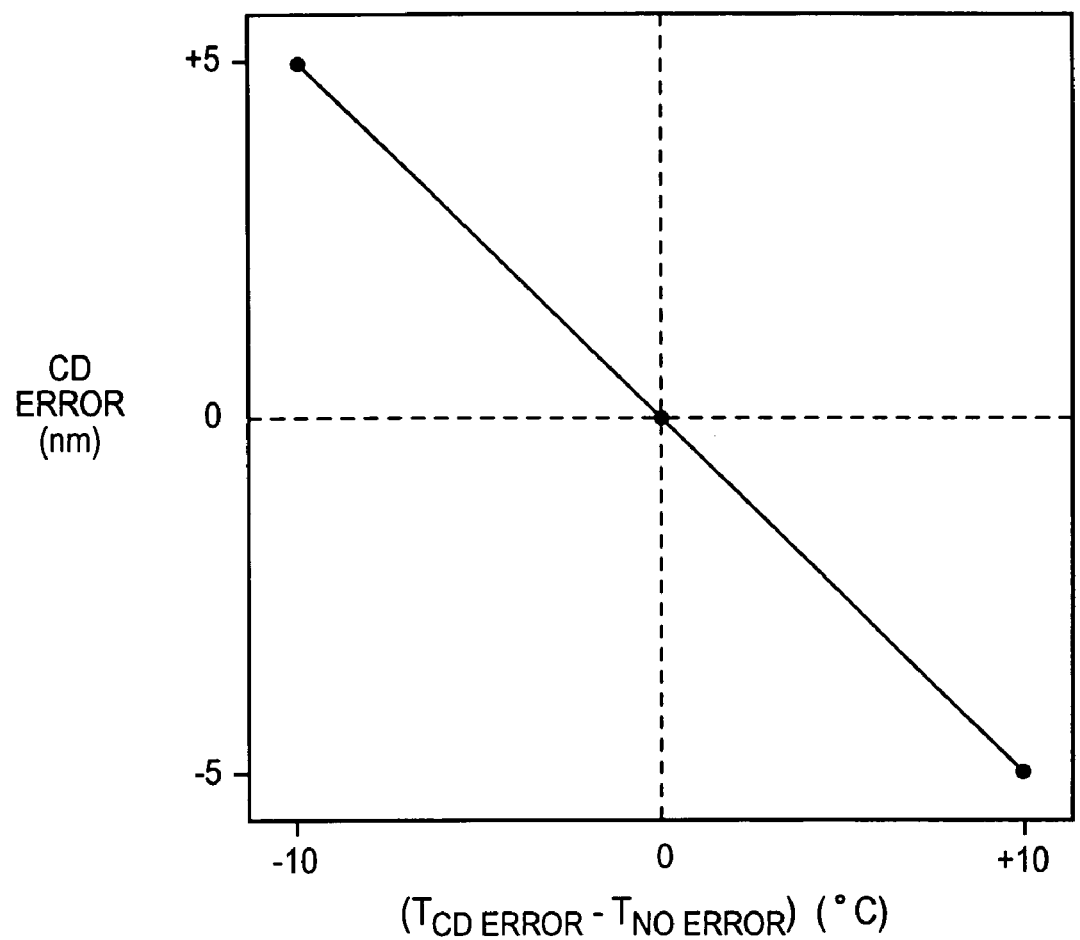
FIG. 10 illustrates an exemplary correlation between critical dimension error and temperature, according to one embodiment.

FIG. 10 conceptually represents an exemplary correlation that may be used to determine a CD error reducing temperature for a system like system 800, according to one embodiment. According to one embodiment, the exemplary correlation pertains to the system comprising a negative type chemically amplified resist one minute after ramping according to the ramping profile shown in FIG. 9.

The correlation relates a magnitude of a CD error and a difference between a CD error reducing temperature ($T_{CD\ error}$) and a temperature corresponding to a conceptual CD having zero error ($T_{No\ error}$). For example, an oversizing error of magnitude+5 may correspond to a CD error reducing temperature that is 10° C. cooler compared with a conceptual zero CD error temperature and an undersizing error of magnitude−5 may correspond to a temperature that is 10° C. hotter compared with the conceptual zero CD error temperature. This exemplary linear correlation may be useful for many embodiments, especially over a narrow range of CD errors, although more sophisticated non-linear correlations are contemplated.

Decrease in Amplifying Catalyst Concentration

Figure 11:
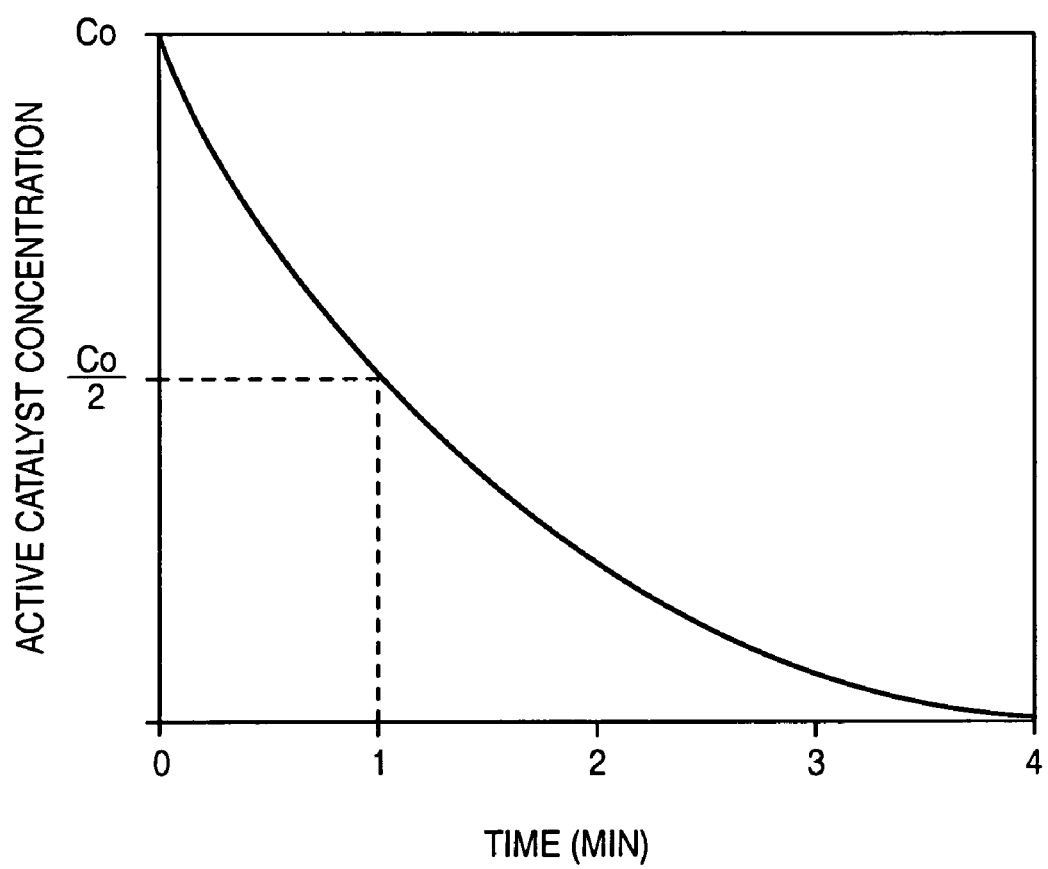
FIG. 11 illustrates an exemplary decrease in active catalyst concentration over time, according to one embodiment.

FIG. 11 conceptually represents, without limitation, a decrease in active catalyst concentration over time that may occur in certain radiation sensitive layers and negative-type chemically amplified resists. The concentration of active catalyst decreases from an initial concentration ($C_0$) to a near zero over several minutes at elevated temperature (e.g., 4 minutes in this particular embodiment). In this particular embodiment, the concentration has decreased to half of the initial concentration (i.e., $C_0/2$), which in this particular embodiment may occur proximate to 1 minute after temperature ramping begins. Without limitation, this may be due to thermal decomposition, steric hindrance, and due to other factors that may affect catalytic activity. According to one embodiment, such decrease in the active catalyst concentration may be measured and used to understand and improve CD error reduction, including developing temperature rate of change profiles, determining thermal gradients, and determining adjustment distances.

Screw Spacer

Figure 12:
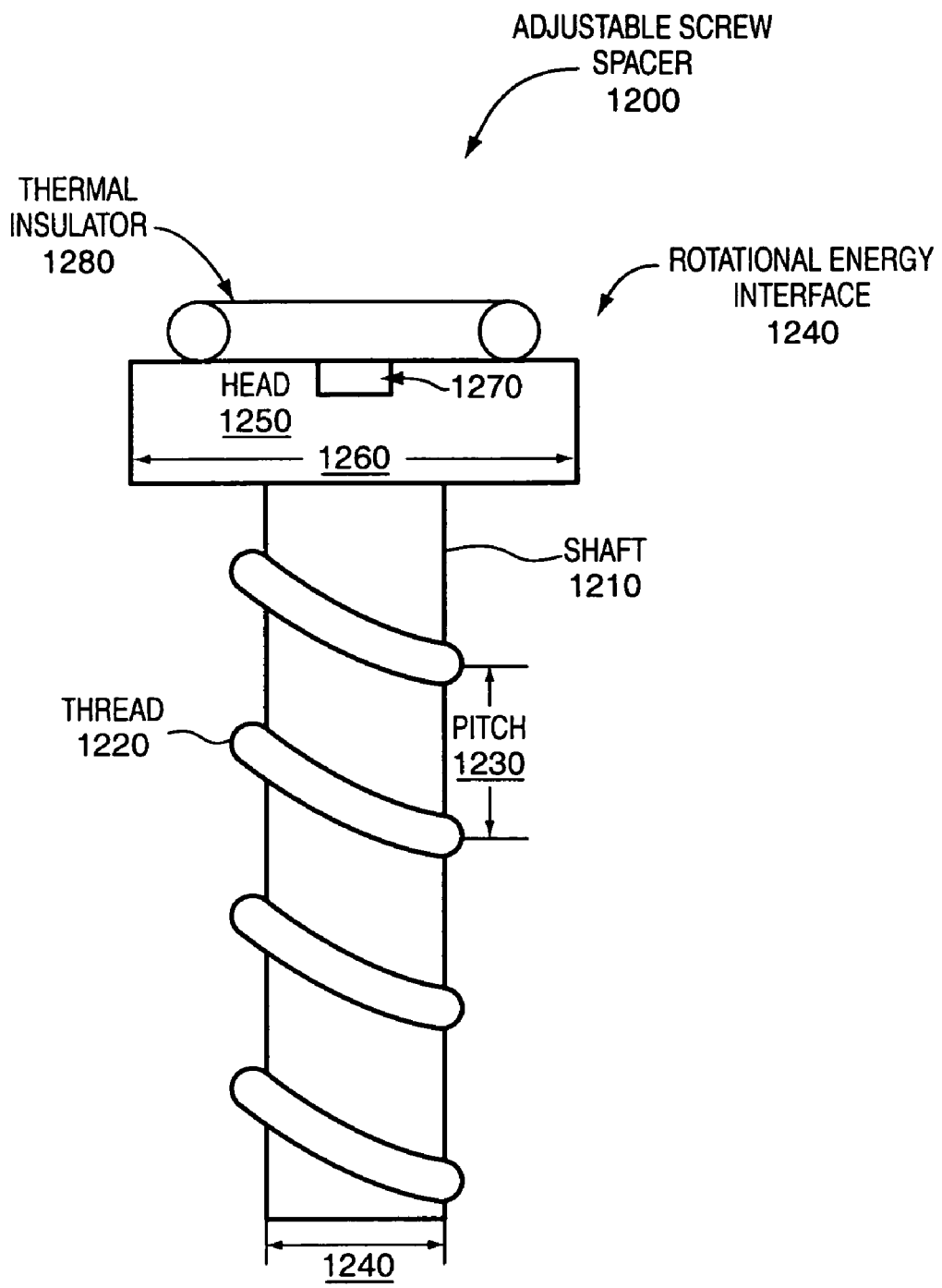
FIG. 12 illustrates an adjustable screw spacer, according to one embodiment.

FIG. 12 conceptually illustrates an exemplary adjustable screw spacer 1200, according to one embodiment. The term "screw" will be used to broadly refer to a device to create substantially linear motion based on rotational energy input. The exemplary screw 1200 comprises a cylindrical shaft 1210 and an inclined plane thread 1220 coupled with and spiraling around the shaft 1210. The thread 1220 may be adhered to the shaft 1210 or carved from the shaft 1210, as desired. The thread 1220 has at least one pitch length 1230, which may be between approximately 0.1 and 1 millimeter, depending on the particular implementation. Longer pitch lengths may be more durable and more economical to manufacture, although shorter pitch lengths may provide more accuracy. Embodiments with multiple different pitches and with a pitch that changes along the shaft 1210 are also contemplated. The shaft 1210 has a diameter 1240 that may be vary over a wide range substantially without limitation, although typically the diameter 1240 will be between 1–10 millimeters.

The exemplary screw 1200 also has a durable head 1250 that has a diameter 1260 that may be larger than the diameter 1240, such as when the diameter 1240 is at the short end of the provided range. The head 1250 often provides a rotational energy interface 1270, which in this case is at least one slotted groove, to interface or engage with a rotational energy source such as a screwdriver. The screw may also comprise a low thermal conductivity insulator 1280, which in this case is a polyamide o-ring, to reduce conductive heat transfer between a thermal source at high temperature and a radiation sensitive layer.

According to one embodiment, the screw adjustable spacer 1200 may be any conventional type of screw. For example, the spacer 1200 may be a slotted-head screw, a leveling screw, a jackscrew, a cap screw, an interrupted screw, a socket-head screw, a round-head screw, a right-hand screw, a left-hand screw, a Phillips machine screw, a Phillips head screw, an Allen screw, a ball screw, a tangent screw, an endless tangent screw, a thumbscrew, a stepped screw, a stage screw, or other types of screws. Advantageously, use of one of these conventional type screws, especially a commercially available conventional type screw, may offer economic advantages. Alternatively, the spacers 860 and 870 may be custom or tailored screws that have features and properties that are shown and described, or that would be apparent to one having an ordinary level of skill in the art based on this disclosure. For example, depending on the particular implementation, spacers according to a predetermined design specification may be obtained from Sigmameltec Ltd. of Asao-Ku, Kawasaki, Japan.

Figure 13:
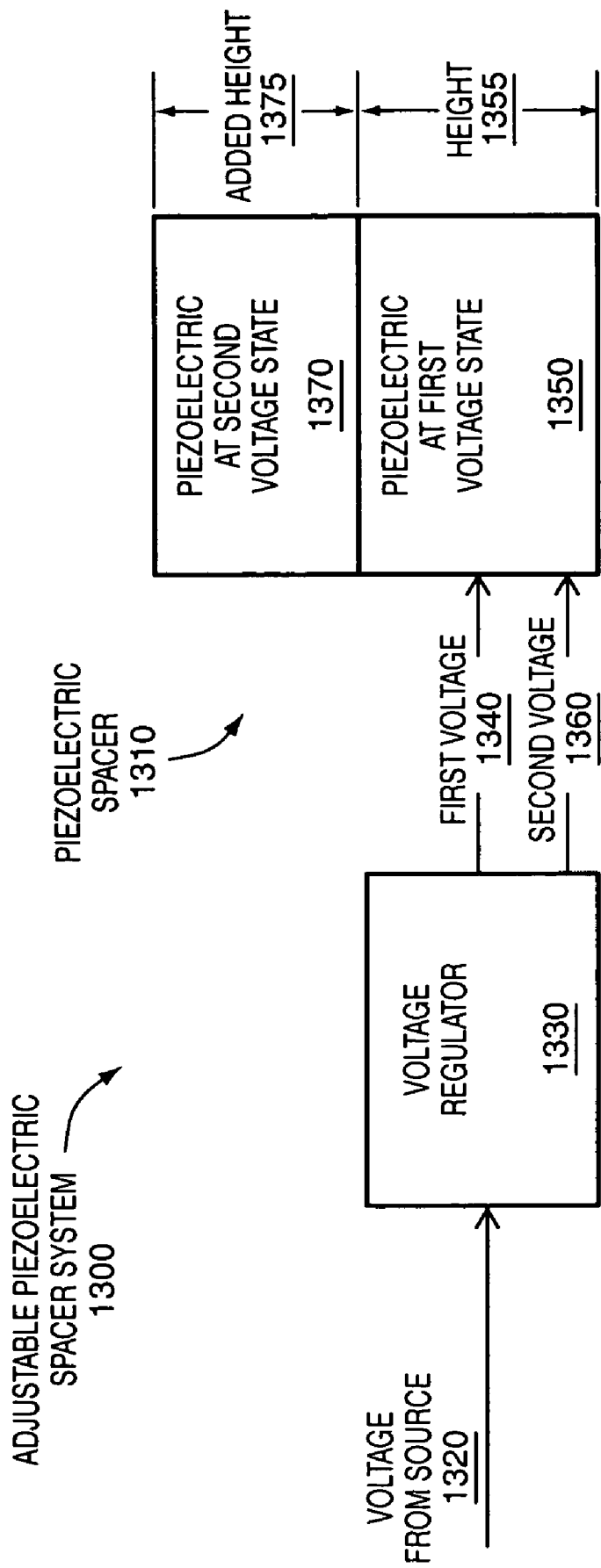
FIG. 13 illustrates an adjustable piezoelectric spacer system, according to one embodiment.

FIG. 13 conceptually illustrates an exemplary piezoelectric adjustable spacer system 1300, according to one embodiment. The spacer system 1300 comprises a voltage regulator 1330 to receive a voltage 1320 from a voltage source and to regulate a magnitude of voltage provided to a piezoelectric spacer 1310. The voltage regulator 1330 may regulate voltage based on predetermined adjustments or settings (e.g., setpoints) provided by humans or systems. For example, according to one embodiment, the regulator 1330 accesses industrial manufacturing quality control data (e.g., CD errors determined by scanning electron microscope) from a memory to determine what types of CD errors have been encountered in the prior quality control lots, and comprises predetermined instructions to correlate the quality control data to an output voltage.

After determining an output voltage, the voltage regulator 1330 asserts or provides a first voltage 1340 to the piezoelectric spacer 1310. For purposes of illustration, the piezoelectric spacer 1310 is shown in a first state 1350 having a first distance or height 1355 that corresponds to the first voltage 1340. By way of example, the first state 1350 and the height 1355 may reduce a CD undersizing error. The system 1300 is adjustable, such that CD errors of a different type or magnitude are encountered, the voltage regulator 1330 may assert or provide a second different voltage 1360 to cause the piezoelectric spacer 1310 to have a second state 1360 that in this case has an added distance or height 1375.

CD Error Reduction System with Removable Spacers

Figure 14:
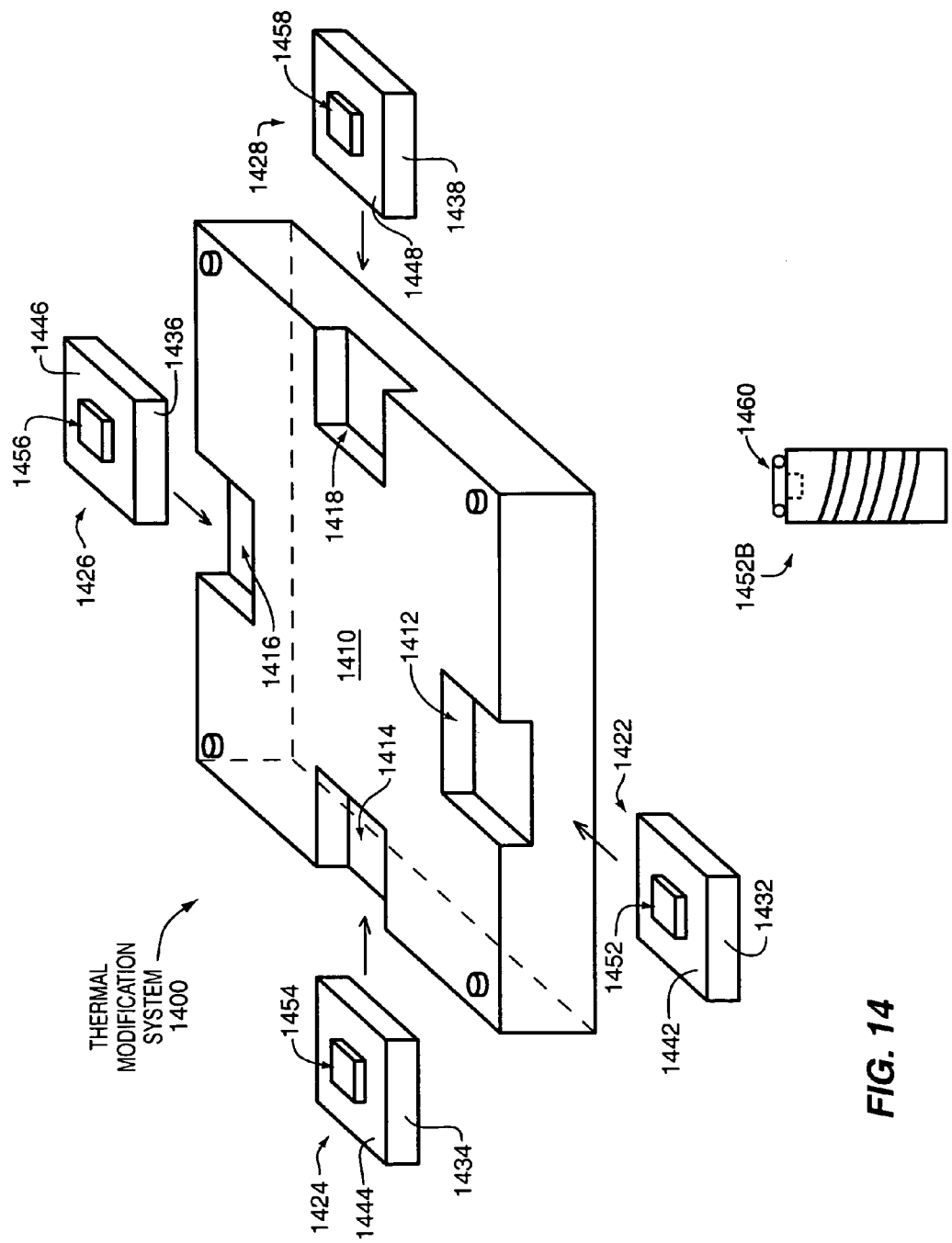
FIG. 14 illustrates a thermal modification system comprising removable spacers, according to one embodiment.

FIG. 14 conceptually illustrates a CD error reducing system 1400 incorporating removable spacers, according to one embodiment. The system 1400 comprises a thermal energy source 1410, which may be a hot plate such as conventionally used in post exposure baking operations. The thermal energy source 1410 comprises four voids 1412, 1414, 1416, and 1418 each configured to receive one of removable spacing systems 1422, 1424, 1426, and 1428. The void 1412 may be a cubic, rectangular solid, cylindrical, triangular, or other form of void of the source 1410 to accommodate a corresponding approximately equally sized and shaped spacing system 1422 to fit within the void 1412 typically with a good, snug, and consistent fitting to encourage reliable performance of the system 1400. As shown, the void 1412 may be along a side. Alternatively, the void 1412 may be located at a corner, or at an interior location. The spacing system 1422 may be made of the same material as the source 1410 or of a different material. Typically, when the materials are different, the coefficients of thermal expansion for the materials will be sufficiently close to avoid stresses and inconsistencies during temperature ramping.

According to one embodiment, each of the spacing systems 1422, 1424, 1426, and 1428 comprise a spacer 1452, 1454, 1456, and 1458 that respectively may extend above a fUnctional top surface 1442, 1444, 1446, and 1448. The top surfaces 1432–1438 may be substantially coplanar with a top functional surface of the source 1410, or they may be elevated or de-elevated with respect to the top surface of the source 1410, as desired. The spacers 1452–1458 may provide a thermal energy gradient, such as described for the systems 700 and/or 800.

According to one embodiment, the spacers 1452–1458 are adjustable. For example, the spacer 1452 may be a screw spacer 1452B that is adjustable by rotation. In this embodiment, the solid 1432 may comprise a cylindrical void (not shown) that may open through a circular opening in the surface 1442. The void may or may not extend and open on a bottom surface of the solid 1432. The cylindrical void may comprise structure corresponding to a thread and shaft of the screw spacer 1452B. The spacer 1452 may also comprise a thermal insulator, such as a polyaniide O-ring 1460. Such a system 1422 incorporating the spacer 1452B may be used by removing the solid 1432 from the void 1412, accurately adjusting the spacer 1452B with a screwdriver so that the spacer 1452B provides a desired distance relative to a top functional surface of the source 1410, accurately measuring the desired distance if desired, and replacing the solid 1432 back into the void 1412 prior to use.

Alternatively, rather than adjustable spacing systems 1422–1428, the systems 1422–1328 may be predetermined spacing systems that are not adjustable. In this embodiment, a plurality of such predetermined systems may be provided to be useful for different magnitudes and types of CD error reduction, so that one may be selected and used without adjustment.

Reduction of Drifting CD Errors

Mask fabrication may be improved, according to one embodiment, by monitoring CD errors for previously fabricated masks and adjusting CD error reduction processing according to this monitoring. Table 1 contains CD error data collected for exemplary mask fabrication equipment.

| DAY | CD ERROR INCREASE IN X-DIRECTION (NANOMETERS) | CD ERROR INCREASE IN Y-DIRECTION (NANOMETERS) |
|---|---|---|
| Jun. 13, 2001 | A | B |
| Jun. 20, 2001 | 0.1A | 2.5B |
| Jun. 27, 2001 | 0.5A | −2B |
| Jul. 04, 2001 | −A | −1.5B |
| Jul. 11, 2001 | −A | −4B |

The first column includes days that multiple masks were fabricated by the equipment. The second and third columns include daily CD error data in terms of A and B, where A and B represent an arbitrary CD error increase in the x-direction and y-direction on the date Jun. 13, 2001. More particularly, the second column includes an average increase in CD error along the mask as x is increased from x=0 to x=$x_{max}$. The third column includes a similar increase as y increases from 0 to $y_{max}$.

As shown, the average magnitude and positional dependency of CD errors may drift or change over time. For example, as shown in Table 1, initially the CD error increased across the mask in both the x and the y-directions, whereas later the CD error tended to decrease as x and y approach $x_{max}$ and $y_{max}$, respectively. This type of knowledge of prior CD errors may be used to perform CD error reduction. For example, in the case of substantially CD undersizing errors and a negative type chemically amplified resist, CD error reduction processing for day Jul. 2, 2001 may be anticipated by applying more thermal energy to a CD errors close to (0, 0) and comparatively less energy to CD errors close to ($x_{max}$ and $y_{max}$).

Alternate Embodiments

The invention is not limited to the particular context and examples described above, and other uses of the invention will be appreciated by a person having an ordinary level of skill in the art and having the benefit of the present disclosure. For example, according to one embodiment, the invention is not limited to the context of CD error reduction and may be used more generally to modify exposure features and CDs regardless of whether they have errors and regardless of whether the errors are reduced. For example, according to one embodiment, a heterogeneous and non-uniform temperature interaction may be used to actively size and shape an exposure image, such as to actively shrink a critical dimension. Other uses are contemplated and will be apparent to one having an ordinary level of skill in the art, based on the present disclosure.

According to another embodiment, the invention is also not limited to mask fabrication and may be used in general to modify an exposure image in a radiation sensitive layer. For example, rather than a radiation sensitive layer associated with mask fabrication, the exposure image may be an exposure image in a layer of a semiconductor device or logic product that is manufactured using the mask.

In conclusion, the present invention provides a system and method for modifying an exposure image in a radiation sensitive layer by providing a non-uniform heterogeneous thermal energy input to the exposure image.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method comprising:
   adjusting a first height adjustable spacer having a first top surface so that the first top surface extends over a top surface of a hot plate by a first distance;
   adjusting a second height adjustable spacer having a second top surface so that the second top surface extends over the top surface of the hot plate by a second distance, wherein the second distance is different than the first distance;
   placing a substrate having an exposed radiation sensitive layer over the first and second top surfaces of the first and second height adjustable spacers; and
   heating the radiation sensitive layer with the hot plate.

2. The method of claim 1, wherein said adjusting the first height adjustable spacer comprises turning a screw.

3. The method of claim 1, wherein said adjusting the first height adjustable spacer comprises adjusting a voltage input to a piezoelectric substance.

4. The method of claim 1, further comprising determining the first distance based on sizing errors of critical dimensions in a region of the exposed radiation sensitive layer proximate the first height adjustable spacer.

5. The method of claim 1, wherein said heating comprises reducing errors in the exposed radiation sensitive layer.

6. The method of claim 5, wherein said heating comprises heating a critical dimension undersizing error to a greater temperature than a critical dimension oversizing error in a negative acting, chemically amplified resist.

7. The method of claim 1, further comprising coupling a surface of the substrate with an insulator that is coupled with the first height adjustable spacer.

8. The method of claim 1, further comprising placing a solid having the first height adjustable spacer coupled thereto in a void in the hot plate.

9. The method of claim 1, wherein the radiation sensitive layer comprises a negative acting, chemically amplified resist.

10. A method comprising:
    placing a substrate having a resist layer over a top surface of a hot plate so that different regions of the resist layer are separated from the top surface of the hot plate by different distances; and
    heating the resist layer by transferring different quantities of heat from the top surface of the hot plate to the different regions of the resist layer.

11. The method of claim 10, further comprising:
    turning a screw; and
    supporting the substrate on the turned screw.

12. The method of claim 10, further comprising:
    adjusting a voltage input to a piezoelectric substance; and
    supporting the substrate on the piezoelectric substance having the adjusted voltage input.

13. The method of claim 10, further comprising determining the different distances based on sizing errors of critical dimensions in the regions.

14. The method of claim 10, wherein said heating comprises reducing exposure errors in the resist layer.

15. The method of claim 10, wherein said heating comprises heating a critical dimension undersizing error to a greater temperature than a critical dimension oversizing error in a negative acting, chemically amplified resist layer.

16. The method of claim 10, wherein said placing comprises placing the substrate into contact with an insulator that is coupled with a height adjustable spacer.

17. The method of claim 10, wherein the resist layer comprises a negative acting, chemically amplified resist.

* * * * *